United States Patent
Bose et al.

(10) Patent No.: US 8,914,764 B2
(45) Date of Patent: Dec. 16, 2014

(54) ADAPTIVE WORKLOAD BASED OPTIMIZATIONS COUPLED WITH A HETEROGENEOUS CURRENT-AWARE BASELINE DESIGN TO MITIGATE CURRENT DELIVERY LIMITATIONS IN INTEGRATED CIRCUITS

(75) Inventors: Pradip Bose, Yorktown Heights, NY (US); Alper Buyuktosunoglu, White Plains, NY (US); John A. Darringer, Mahopac, NY (US); Moinuddin K. Qureshi, White Plains, NY (US); Jeonghee Shin, Millwood, NY (US)

(73) Assignee: International Business Machines Corporation, Armonk, NY (US)

( * ) Notice: Subject to any disclaimer, the term of this patent is extended or adjusted under 35 U.S.C. 154(b) by 245 days.

(21) Appl. No.: 13/526,252

(22) Filed: Jun. 18, 2012

(65) Prior Publication Data

US 2014/0195996 A1     Jul. 10, 2014

(51) Int. Cl.
*G06F 9/455* (2006.01)
*G06F 17/50* (2006.01)

(52) U.S. Cl.
CPC ........ *G06F 17/5072* (2013.01); *G06F 17/5036* (2013.01)
USPC ............ 716/133; 716/120; 716/127; 716/132

(58) Field of Classification Search
CPC ............ G06F 17/5068; G06F 17/5072; G06F 17/5081; G06F 2217/40; G06F 2217/78
USPC .................................. 716/120, 127, 132, 133
See application file for complete search history.

(56) References Cited

U.S. PATENT DOCUMENTS

| | | | |
|---|---|---|---|
| 5,404,310 A | 4/1995 | Mitsuhashi | |
| 5,471,591 A | 11/1995 | Edmonson et al. | |
| 5,581,475 A | 12/1996 | Majors | |
| 5,630,157 A | 5/1997 | Dwyer, III | |
| 5,646,868 A | 7/1997 | Ueda et al. | |
| 5,881,308 A | 3/1999 | Dwyer, III | |
| 5,941,983 A | 8/1999 | Gupta et al. | |
| 5,983,335 A | 11/1999 | Dwyer, III | |
| 6,247,162 B1 | 6/2001 | Fujine et al. | |
| 6,321,168 B1 | 11/2001 | Shimazaki | |

(Continued)

OTHER PUBLICATIONS

"Package-Chip Co-Design to Increase Flip-Chip C4 Reliability", by Sheldon Logan, and Mathew R. Guthaus, IEEE @2011.*

(Continued)

*Primary Examiner* — Nha Nguyen
(74) *Attorney, Agent, or Firm* — Scully, Scott, Murphy & Presser, P.C.; Jennifer Davis, Esq.

(57) ABSTRACT

A dynamic system coupled with "pre-Silicon" design methodologies and "post-Silicon" current optimizing programming methodologies to improve and optimize current delivery into a chip, which is limited by the physical properties of the connections (e.g., Controlled Collapse Chip Connection or C4s). The mechanism consists of measuring or estimating power consumption at a certain granularity within a chip, converting the power information into C4 current information using a method, and triggering throttling mechanisms (including token based throttling) where applicable to limit the current delivery per C4 beyond pre-established limits or periods. Design aids are used to allocate C4s throughout the chip based on the current delivery requirements. The system coupled with design and programming methodologies improve and optimize current delivery is extendable to connections across layers in a multilayer 3D chip stack.

21 Claims, 15 Drawing Sheets

(56) References Cited

U.S. PATENT DOCUMENTS

| | | |
|---|---|---|
| 6,532,570 B1 | 3/2003 | Mau |
| 7,050,871 B2 | 5/2006 | Bartley et al. |
| 7,096,174 B2 | 8/2006 | Beattie et al. |
| 7,131,096 B1 | 10/2006 | Balsdon et al. |
| 7,203,629 B2 | 4/2007 | Ozis et al. |
| 7,233,889 B2 | 6/2007 | Takasashi et al. |
| 7,257,796 B2 | 8/2007 | Miller et al. |
| 7,370,303 B2 | 5/2008 | Einspenner et al. |
| 7,386,824 B2 * | 6/2008 | Porter et al. .................. 716/122 |
| 7,447,602 B1 | 11/2008 | Bradley et al. |
| 7,530,040 B1 | 5/2009 | Balsdon et al. |
| 7,659,622 B2 | 2/2010 | Dauksher et al. |
| 7,721,245 B2 | 5/2010 | Maziasz et al. |
| 7,784,010 B1 | 8/2010 | Balsdon et al. |
| 7,797,654 B2 | 9/2010 | Tai et al. |
| 7,805,689 B2 | 9/2010 | Ueda et al. |
| 7,810,058 B1 | 10/2010 | Tuan |
| 7,823,102 B2 * | 10/2010 | Chandra et al. .............. 716/106 |
| 7,844,438 B1 | 11/2010 | Verghese et al. |
| 7,873,933 B2 | 1/2011 | Harrer et al. |
| 7,941,779 B2 | 5/2011 | Rahmat et al. |
| 8,006,212 B2 * | 8/2011 | Sinha et al. .................. 716/122 |
| 8,053,748 B2 | 11/2011 | Shah et al. |
| 8,176,212 B1 * | 5/2012 | Smith et al. ........................ 710/8 |
| 8,689,160 B2 * | 4/2014 | Lin et al. ........................ 716/113 |
| 2002/0112212 A1 | 8/2002 | Cohn et al. |
| 2003/0028337 A1 | 2/2003 | Mayo et al. |
| 2003/0069722 A1 | 4/2003 | Beattie et al. |
| 2003/0204340 A1 | 10/2003 | Ootouge |
| 2004/0111596 A1 * | 6/2004 | Rawson, III ...................... 713/1 |
| 2005/0076317 A1 | 4/2005 | Ling et al. |
| 2005/0108667 A1 | 5/2005 | Iadanza et al. |
| 2006/0184904 A1 | 8/2006 | Murgai et al. |
| 2007/0098037 A1 * | 5/2007 | Hamann et al. .............. 374/137 |
| 2007/0124616 A1 * | 5/2007 | Gonzalez et al. ............. 713/300 |
| 2008/0059919 A1 | 3/2008 | Harrer et al. |
| 2008/0092092 A1 | 4/2008 | Dalton et al. |
| 2009/0019411 A1 * | 1/2009 | Chandra et al. ................... 716/9 |
| 2009/0113049 A1 | 4/2009 | Nasle et al. |
| 2010/0244102 A1 | 9/2010 | Kusumoto |
| 2011/0012260 A1 * | 1/2011 | Tokunaga et al. ............. 257/738 |
| 2011/0079924 A1 * | 4/2011 | Suh ................................ 257/777 |
| 2011/0173581 A1 | 7/2011 | Koushanfar et al. |
| 2011/0276787 A1 | 11/2011 | Koga et al. |
| 2012/0025403 A1 * | 2/2012 | Yokogawa .................... 257/786 |
| 2012/0210325 A1 * | 8/2012 | de Lind van Wijngaarden et al. ............................. 718/103 |
| 2012/0242149 A1 | 9/2012 | Chuang et al. |
| 2013/0097409 A1 | 4/2013 | Yamana |
| 2013/0167100 A1 * | 6/2013 | Guthaus ........................ 716/124 |
| 2013/0262831 A1 | 10/2013 | Nelson et al. |
| 2013/0339917 A1 | 12/2013 | Darringer et al. |

OTHER PUBLICATIONS

Master et al., "Electromigration of C4 bumps in Ceramic and Organic Flip-Chip Packages", 2006 Electronic Components and Technology Conference, 2006 IEEE, pp. 646-649.

Haberland et al., "Current Loadability of ICA for Flip Chip Applications", 4th Electronics Packaging Technology Conference, 2002.

Logan et al., "Package-Chip Co-Design to Increase Flip-Chip C4 Reliability", IEEE 12th Int'l Symposium on Quality Electronic Design 2011, pp. 553-558.

Peng et al., "Simultaneous Block and I/O Buffer Floorplanning for Flip-Chip Design", in Design Automation, 2006. Asia and South Pacific Conference, Jan. 2006, IEEE 2006, pp. 213-218.

Todri et al., "Power Supply Noise Aware Workload Assignment for Multi-Core Systems", IEEE/ACM International Conference on Computer-Aided Design, 2008.

Office Action dated Mar. 11, 2013 received in a related U.S. Appl. No. 13/526,230.

Notice of Allowance dated Aug. 5, 2013, received in a related U.S. Appl. No. 13/526,230.

Nagaraj, "Flip Chip Back End Design Parameters to Reduce Bump Electromigration", The University of Texas at Arlington, Aug. 2008.

\* cited by examiner

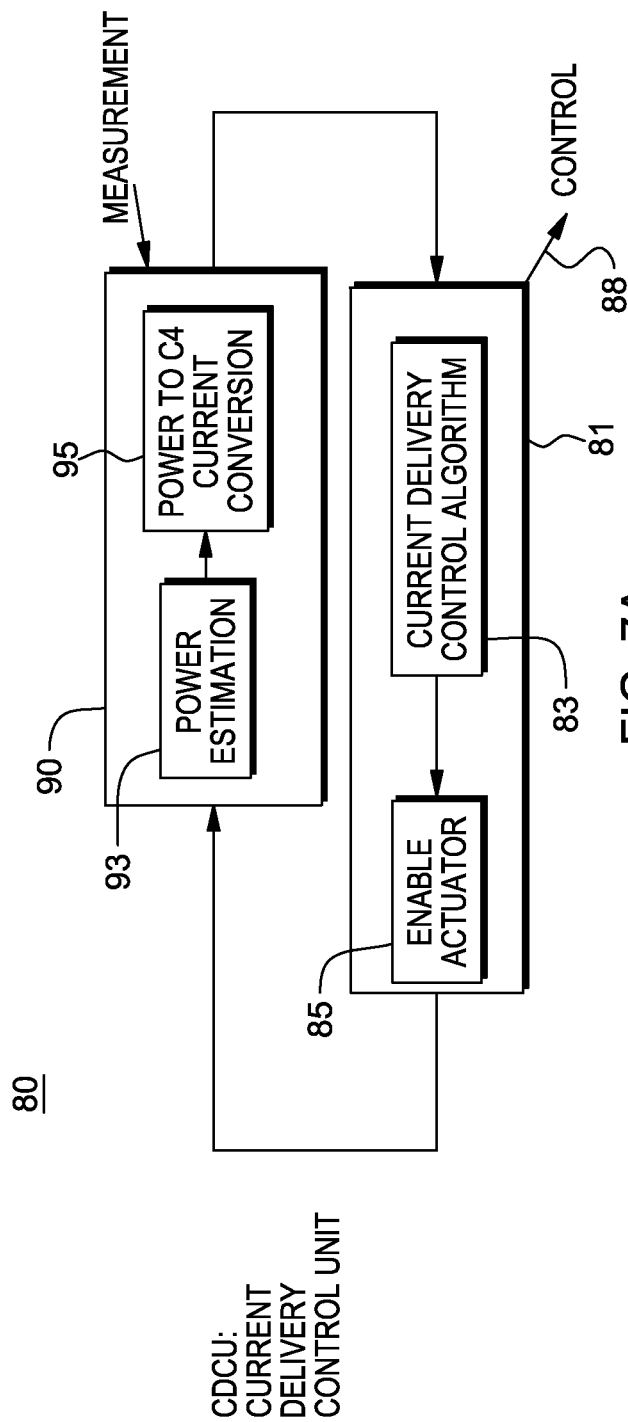

500

510
INTILIZATION:
BASED ON PRESILICON/POSTSILICON MODELING
token_generation_cyc=X;
token_generation_amount=T;
token_expiry_period=T_exp;
LSU_tresv=0;

515
OPERATES AT EVERY X CYCLES:
ADD T TOKENS TO LSU_tresv

520
IF(ISU ISSUES AN LSU INSTRUCTION &&
LSU_tresv>0)
{ISSUE LSU INSTRUCTION
LSU_tresv=LSU_tresv-1}
ELSE
{DO NOT ISSUE LSU INSTRUCTION}

530
FOR EACH TOKEN IN LSU
IF(TOKEN_lifetime>T_exp)
{LSU_tresv=LSU_tresv-1}

FIG. 11

ADAPTIVE WORKLOAD BASED OPTIMIZATIONS COUPLED WITH A HETEROGENEOUS CURRENT-AWARE BASELINE DESIGN TO MITIGATE CURRENT DELIVERY LIMITATIONS IN INTEGRATED CIRCUITS

GOVERNMENT CONTRACT

This invention was made with Government support under Contract No.: N66001-11-C-4027 awarded by Defense Advanced Research Projects Agency (DARPA). The Government has certain rights in this invention.

BACKGROUND

The present disclosure relates to semiconductor device design, manufacture and packaging methods to improve electrical current delivery into a semiconductor chip.

Flip chip generally uses the Controlled Collapse Chip Connection or, C4, technology to interconnect semiconductor devices of IC chips or Microelectromechanical systems (MEMS), or alternatively, the chip die, to packages for connection to external circuitry with solder bumps that have been deposited onto the chip pads. Power has to be delivered to die from package through these C4 bumps. There is a limit as to how much current each C4 bump can carry. This limit must be managed.

The C4 current limit is set by the target electromigration lifetime governed by several key factors. As shown in FIG. 1, key factors 10 that effect C4 lifetime electromigration reliability 11 include: C4 technologies 12 (e.g., lead-free, design structure/mechanics, pad shape/structure); C4 operating currents 14, and C4 operating temperatures 16—all which effect electromigration reliability of the chip over time. Factors effecting C4 operating currents include the amount of current drawn by integrated circuit devices 14a on the chip or die, the density and location of the C4 bumps 14c, and the power grid networks 14b that connect the devices and the C4 bumps. That is, the power dissipated or current drawn by the devices is delivered from the package pins through substrate wires therein through the C4 connections to distribute current to the chip die through one or multiple chip wiring levels. Thus, current delivery design factors include the amount of current drawn by and the location of operating devices at the die, how they are wired (designed power grid between C4s and devices), and how many C4s are populated in a unit area and how they are placed, all effect C4 current draw and ultimately chip reliability susceptible to electromigration.

In semiconductor chip manufacturing, C4 current limits are becoming difficult to meet due to a variety of factors including: increasing use of Pb-free C4; higher target frequencies of IC chip operation; and frequency boosted modes of operation. It would be highly desirable to provide a current-aware floorplanning semiconductor chip design mechanisms to manage current draw through C4 connectors. However, there are currently no known automated mechanisms that floorplan standard cells composed of devices or higher-level units composed of cells for the balanced current or reliability of C4 bumps.

There are dynamic management mechanisms used in other areas such as power or temperature, but none for current management. Such existing mechanisms may indirectly control the exposure to excessive current delivery, but they cannot directly keep C4 current to be met the limit.

In addition, dynamic current management mechanisms can be coupled with static design methodologies such as C4 current-aware floorplanning and C4 placement optimization in order to improve current delivery into a chip as well as performance.

SUMMARY

There is provided a system and design methodology for improving current delivery into a chip, which is limited by the physical properties of the physical connections such as C4 bumps between chips and the package, micro bumps or TSVs (through silicon vias) between two chips or any other electrical connections for power delivery. Further implemented is a dynamic mechanism for measuring or estimating power consumption at a certain granularity within a chip, converting the power information into the connections current, and triggering throttling mechanisms where applicable, to limit the current delivery per connection beyond pre-established limits or periods.

The design methodology also includes providing automated design aids to floorplan individual or a set of devices based on the current delivery requirements.

The design methodology further includes a methodology that allocates the connections unevenly over units or cores and exploits the distinct current delivery requirements to the units or cores by dynamic workload scheduling.

Thus, according to one embodiment, there is provided a system, method and computer program product for integrated circuit (IC) chip and package design and IC chip operation comprising: generating a data structure representing a current distribution relation between one or more current sources within a layout region of the chip, and one or more physical structures that deliver electrical current drawn by the current sources in the layout region as connected via grid networks in the IC; obtaining, using the data structure, an amount of current flow via the physical structures with respect to an amount of current drawn by current sources; and determining, using the current flow and current drawn amounts, locations of blocks having the one or more current sources, with respect to one or more objectives and constraints, the block locations effecting a non-uniform allocation of physical structures to blocks in one IC region than blocks in other regions having like one or more current sources, and, subsequently operating blocks in the regions at current draw activity levels according to the non-uniform allocation, wherein a programmed processor unit performs one or more the generating, obtaining, determining and operating.

Further to this aspect, a block includes a central processing unit including one or more cores therein in the layout region, a core including a bus unit, cache memory, fetch unit, decode unit, instruction sequencing unit, execution units such as fixed point unit, floating point unit, load/store unit.

Furthermore, the block locations effect a non-uniform allocation of physical structures to blocks according to a target power delivery requirement of each the blocks, wherein an allocation of physical structures to grid networks is optimized with respect to different power corners.

Additionally, the method comprises: scheduling, at an operating system (O/S) or hypervisor of a host system, an application to run at the IC at scheduled times, the application being scheduled for processing at a region of the layout by: allocating applications to cores based on the type of instructions in the workload.

According to a further aspect, a system for integrated circuit (IC) chip and package design and IC chip operation comprises: a computer system including a programmed processor unit and a memory storage device in communication with the processor unit, the programmed processor unit configured to: generate a data structure representing a current distribution relation between one or more current sources within a layout region of the chip, and one or more physical structures that deliver electrical current drawn by the current sources in the layout region as connected via grid networks in the IC; obtain, using the data structure, an amount of current flow via the physical structures with respect to an amount of current drawn by current sources; and determine, using the current flow and current drawn amounts, locations of blocks having the one or more current sources, with respect to one or more objectives and constraints, the block locations effecting a non-uniform allocation of physical structures to blocks in one IC region than blocks in other regions having like one or more current sources, and, subsequently operate blocks in the regions at current draw activity levels according to the non-uniform allocation, wherein a programmed processor unit performs one or more the generating, obtaining, determining and operating.

A computer program product is provided for performing operations. The computer program product includes a storage medium readable by a processing circuit and storing instructions run by the processing circuit for running a method. The method is the same as listed above.

BRIEF DESCRIPTION OF THE DRAWINGS

The present disclosure will be described with reference to FIG. 1-15. When referring to the figures, like elements shown throughout are indicated with like reference numerals.

FIGS. 7A-7C depict alternative hardware embodiments for dynamically measuring the C4 current drawn at various chip regions operating under various workload conditions, and for providing dynamic current delivery control at operating units in the regions;

FIG. 11 particularly shows a method 500 that, in a sliding window of time, a particular unit is issued tokens when a unit is to perform high activity for a unit of time;

DETAILED DESCRIPTION

The present system and method addresses the criticality of C4 current reduction during "pre-Silicon" chip planning and design as well as during "post-Silicon" (after chip designs are fixed and applications are run) phases, e.g., through dynamic workload optimization techniques.

Further, the electrical current delivery aware chip design methodologies include "pre-Silicon" and "post-Silicon", and hybrid (combination of pre- and post-Silicon) approaches to analysis, design, implementation and optimization of chip and package designs.

Current-Aware Floorplanning

Figure 1:
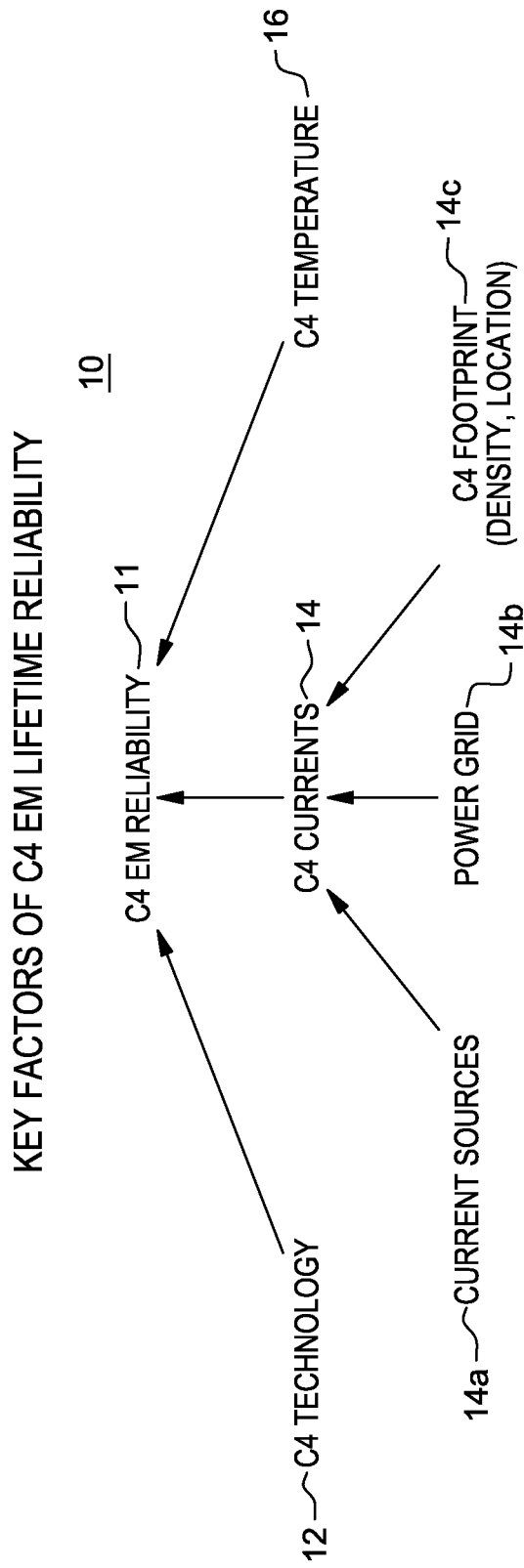
FIG. 1 shows those factors 10 that effect C4 lifetime electromigration reliability in a semiconductor chip.
Figure 2:
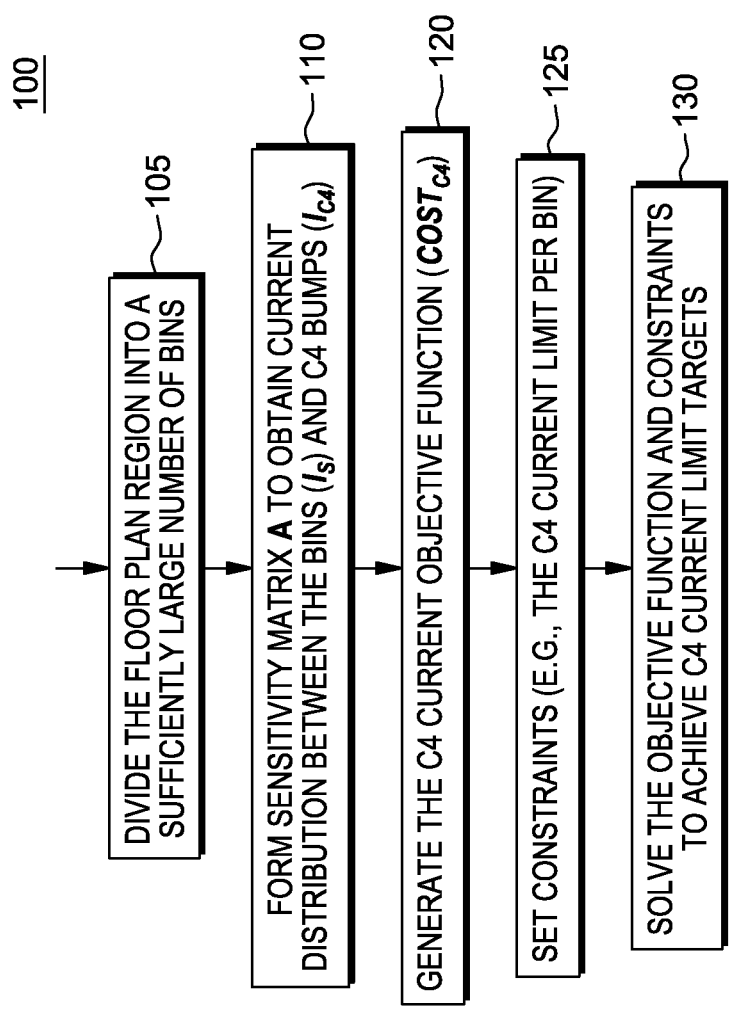
FIG. 2 illustrates an example method 100 performing calculations that obtain the C4 number and placement options given C4 current optimization and/or other constraints in one embodiment.

For example, as shown in FIG. 2, the pre-Silicon approach includes the floorplanning, designing where the devices, or standard cells or blocks composed of multiple devices are placed, with respect to power dissipation and C4 placement. The "pre-Silicon" floorplanning approach is "current aware" because the location of the devices, cells or blocks is determined by current profiles across the chip and thus they are placed to minimize maximum C4 current or balance C4 currents. For example, certain blocks that draw high current may be placed apart or under higher dense C4 area.

The current-aware floorplanning approach is distinct to another "pre-Silicon" approach claimed in co-pending U.S. patent application Ser. No. 13/526,194; in the prior art, the placement of C4 bumps is optimized while the floorplan and the current profile are fixed.

Figure 6:
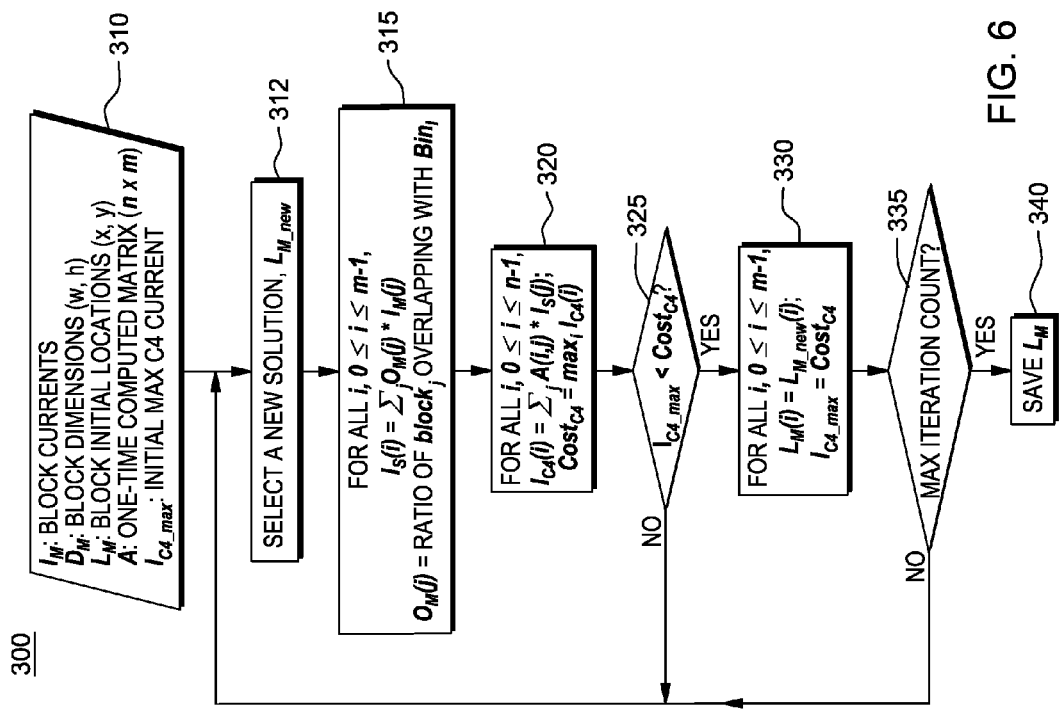
FIG. 6 shows, in one embodiment, an example C4 Current-Aware Floorplanning Implementation example 300.

An exemplary implementation of the current-aware floorplanning methodology is shown in FIGS. 2 and 6. Instead of the iterative approach shown in FIG. 6, an analytical solver can be used to find the optimal location of blocks. In an embodiment of the method 100 of FIG. 2, there are two major steps: 1) creating a one-time computed matrix that captures current distribution relation between a set of current sources (represented as a plurality of "bins" covering the active IC semiconductor area), and a set of voltage sources (e.g., pin interconnect structures such as C4 bumps), and 2) formulating objective functions and constraints and solving them to find the optimal floorplan by minimizing the cost while satisfying the constraints. In one embodiment, in the automated current-aware floorplanning methodology, the current distribution relation remains the same while the location of the devices cells or blocks may change to find the optimal solution, and is captured in a one-time computed matrix. This is done by associating the current sources not with the moving blocks but with the stationary "bins" or regions which the floorplan region is divided into. As referred to herein, a "block" includes a current source including, but not limited to, one or more electrical or integrated circuit devices that draw current or dissipate power while operational or non-operational (via transistor current leakage, for example). More specifically, the moving or locatable "block" or "blocks" during floorplanning may include, but are not limited to: a transistor device(s), gates comprising a plurality of transistor devices, standard cells comprising a plurality of gates, macros comprising a plurality of standard cells, a unit comprising a plurality of macros, a processing "core" or cores comprising one or more units, and a Central Processing Unit (CPU) including one or more cores, accelerator units, on-chip bus/network units, controller units, I/O units.

The floorplan region is divided into a sufficiently large number k of "bins" at 105. A data structure such as a matrix capturing the current distribution relation between the bins and the C4 bumps is generated at 110 by using, in one embodiment, a sensitivity analysis methodology such as described in co-pending U.S. patent application Ser. No. 13/526,194.

Figures 3, 4:
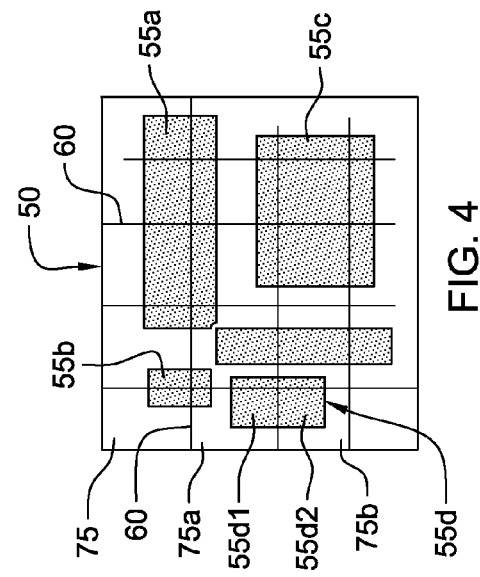
FIG. 3 depicts an equation for calculating the C4 currents vector $I_{C4}$ associated with the bins given matrix A, and current sources vector $I_S$, in accordance with one embodiment.
FIG. 4 shows, in one embodiment, the binning approach to generate the sensitivity matrix A of FIG. 3.

FIG. 4 shows the binning approach to generate the sensitivity matrix A. The example die floorplan or floorplan portion 50 shown in FIG. 4 includes IC blocks 55a, 55b, 55c, and 55d, for example, overlayed with a uniform grid shown as a pattern or network of grid lines 60 that define and fix locations of the bins 75. The grid (and consequently, the bins) can be irregular in size as well. The blocks 55a, 55b, 55c, and 55d are movable during floorplanning, but the bins 75 are fixed. The current demand of the blocks is distributed per bin, such that as the two or more bins overlap a block the current demand of that block is divided proportionately among the overlapped bins. For examples, as shown in FIG. 4, the overlap of portions 55d1 and 55d2 of block 55d with the respective bins 75a, 75b drives the respective current of respective bins 75a, 75b according the ratio of the overlapped portion to the total area of the unit 55d and the current drawn in each bin.

Figure 5:
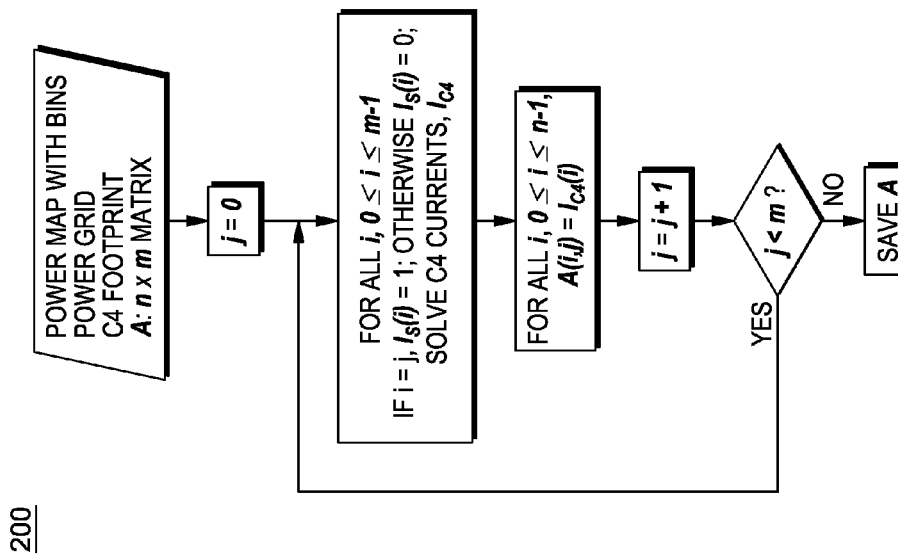
FIG. 5 shows, in one embodiment, an algorithm 200 for generating matrix A of FIG. 3.

FIG. 5 shows an exemplary implementation of the matrix generation process based on systems and methods of herein incorporated, co-pending U.S. patent application Ser. No. 13/526,194. There is generated a sensitivity matrix A that represents the current distribution relation between bins and the C4 bumps. That is, the sensitivity matrix A, an n×m matrix, represents a resistive network between m bins and n C4 bumps, e.g., structures like pins of chip packages, pins between chips and packages, pins between chips, etc.

To compute the sensitivity of C4 currents with respect to each bin, the current of the selected bin is assumed a unit current (e.g., 1 A) and that of the other bins no current, i.e., 0 A. Then, the C4 currents obtained by power grid analysis and divided by 1 A (i.e., the applied current to the selected bin) indicate what portion of the bin current is distributed to each C4 bump. This sensitivity of C4 currents with respect to the selected bin is a weighted vector saved to the corresponding column of matrix A. Once this matrix A is created, the C4 currents vector $I_{C4}$ associated with the bin currents vector $I_S$ is calculated in accordance with the equation depicted in FIG. 3, as follows:

$$I_{C4} = A \cdot I_S.$$

Returning back to FIGS. 2 and 6, the current-aware floorplanning starts with the matrix, block information (such as current, dimension and initial location) and objectives (such as max C4 current) at 310. In FIG. 6, as an example, a programmed computer running a set of stored processing instructions receives at 310 the following inputs: $I_M$: block currents; $D_M$: the block dimensions in width and height (w, h); $L_M$: the initial block locations coordinates (x, y) in the floorplan; A: the one-time computed matrix (n×m); and $I_{C4\_max}$: the initial max C4 current. At 312 there is performed setting a new solution variable, $I_{M\_new}$ indicating a new chip layout design (new macro location coordinates providing current sources).

The loop composed of 312 to 335 implements an iterative approach to find the optimal floorplan. At 315, the mapping of the moving blocks to the stationary bins is performed in the form of a loop that iterates over all bins i such that, for all i, $0 \le i \le m-1$, the total current of bin i, $I_S(i)$, is the summation of a product of the $I_M$: Macro$_j$ current portion and the ratio of Macro$_j$ overlapping with Bin$_i$ (i.e., summed over all overlapping blocks at that bin i). Then, at 320, each C4 current is computed by sum of currents contributed by each bin, based on the computed sensitivity matrix A. The cost (Cost$_{C4}$) is additionally generated at 320 (with constraints) as a function of $\max_i I_{C4}(i)$, the maximum current among the n C4 bumps. Continuing at 325, FIG. 6, a determination is made as to whether the maximum current, i.e., Cost$_{C4}$, is smaller than the C4 current limit, $I_{C4\_max}$. If at 325 it is determined that the maximum current is larger than the C4 current limit, the process returns to step 312 and steps 315, 320 and 325 are repeated. As such, the new block locations are ignored. Otherwise, at 325 if it determined that the $I_{C4\_max}$ is larger than the cost, then the process continues at step 330 where an iteration is performed over all blocks i to set the current $L_M$: macro locations to $L_{M\_new}$ and $I_{C4\_max}$ is set to the maximum current. The process proceeds to 335 where it is determined whether a maximum iteration count has been reached for obtaining for iterating among floorplan designs. If the maximum count has not been reached, then the process returns again to 312 to select a new solution $L_{M\_new}$. Otherwise, if the maximum iteration count has been reached, then the latest $L_M$ floorplan locations are output and/or saved to memory at 340 indicating where to place the blocks for this design example.

If an analytical solver is used, 312 to 335 are replaced with the evaluation of the following cost functions with the solver:

$$\text{Cost}_{C4} = \max_k i_{c4_k}$$

subject to the C4 current limit constraint:

$$i_{c4_k} \le i_{c4_{max}}, k=0,1,\ldots,n-1$$

where n is the number of C4 bumps.

C4 Current Reduction Through Instruction/Workload Based Optimizations

A post silicon approach is "current aware," i.e., given the fixed layout (floor plan of devices, macros, units, cores, CPUs, etc. and C4 layout), by proper dispatching of the instructions or scheduling workloads properly on the CPU to balance and lower C4 current draw. This guarantees that the C4 current limit is met at any time or never exceeds a determined value for a period of time of operation.

Hybrid: Chip Design and Workload Based Optimization

Thus, in one aspect, in the "pre-Silicon" approach of a multi-core processor chip, C4s are designed and allocated unevenly to cores or units, and in the "post-Silicon" approach, workload based optimization is performed to exploit the heterogeneity.

Adaptive C4 Current-Reduction Utilizing Workload Behavior

In pre-Silicon phase, currents and costs can be optimized, but there are cases in chip design in which current may not be optimized, e.g., one or more C4 connections can not meet the C4 current limitations if operated under some work load condition.

Thus, in a further embodiment, instead of designing a floorplan for worst-case corner or condition (e.g. a work load that stresses C4 connection the most), the floorplan could be designed for average case behavior (a relaxed C4 current limit condition) and the C4 connections are monitored dynamically. In such a design, the C4 current reduction is obtained through workload based optimizations. In one embodiment, the method will identify which C4 connections are non-optimized, i.e., currents may exceed the current limit condition in a particular location.

In one embodiment, as shown in FIG. 7A, a chip, such as an electronic control device or as part of an on-chip microcontroller, is formed in the die to monitor the C4 usage at various locations and ensure that the C4 current limits are not exceeded at those locations. In other embodiments, this can be performed by an operating system or hypervisor scheduler or under software program control. In each embodiment, the controller will stop operations in the functional unit, for example, to prevent the amount of current flowing through the corresponding C4 connections from exceeding their designed C4 current limits.

In one embodiment, there is dynamically measured the C4 current as a workload runs. More particularly, in a hardware implementation as shown in FIG. 7A, during run time, the on-chip controller (which may be firmware) or global Current Delivery Control Unit 80 (CDCU), is a processing loop, performs both current control and a current measurement technique that measures activity levels at various functional blocks and/or C4 connections of the die. In one embodiment, the CDCU control block 81 implements a current control delivery algorithm 83 that operates to control the built in actuators 85 that invoke measuring operations 90. In the embodiment of FIG. 7A, the operations include invoking power estimation sensors that directly sense and perform power sensor estimation of the power consumption based under workload conditions at 93, and at 95, corresponding estimated power levels are subject to power to current conversion operation to obtain the real-time C4 current measures at the die under the workload conditions. Systems and methods for estimating power in a chip is known in the art (power proxies).

Figure 7B:
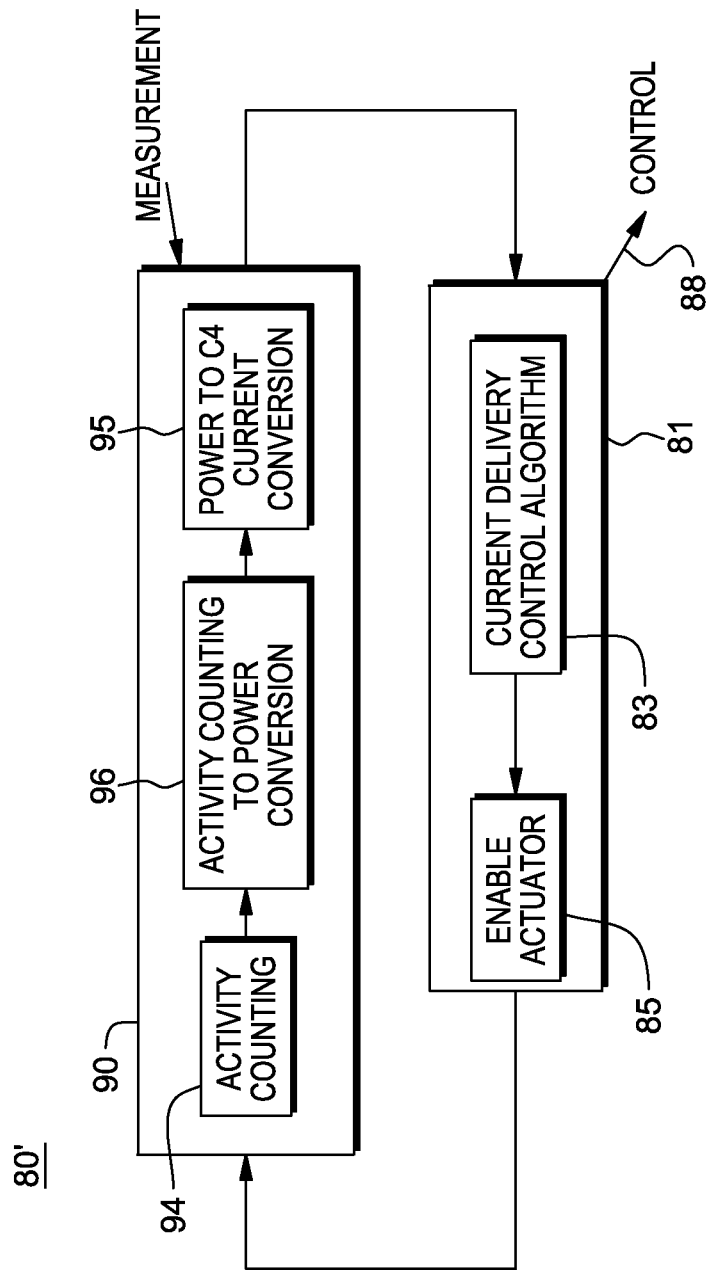

In an alternative or additional embodiment as shown in FIG. 7B, a global CDCU control block 80', as in the CDCU 80 of FIG. 7A, implements a current control delivery algorithm 83 that operates to control the built in actuators 85 for invoking the measuring operations 90 which include: at 94, the measuring of activity levels at various functional blocks and/or C4 connections of the die. In one embodiment, the measuring of activity levels at various functional blocks and/or C4 connections of the die address the C4 connections that are shared across blocks or blocks with non uniform current demands. Further, at 96, there are performed operations to convert the measured activity levels to a power level. Then, at 95, the corresponding converted power levels are converted to current levels to obtain the real-time C4 current measures at the die under the workload conditions. More specifically, at the end of the conversion process, a matrix (not shown) is obtained that provides a current map depending on the dynamic activity when a workload is run. Such a dynamic current map can be used in leverage with certain actuators to solve current delivery problem.

Figure 7C:
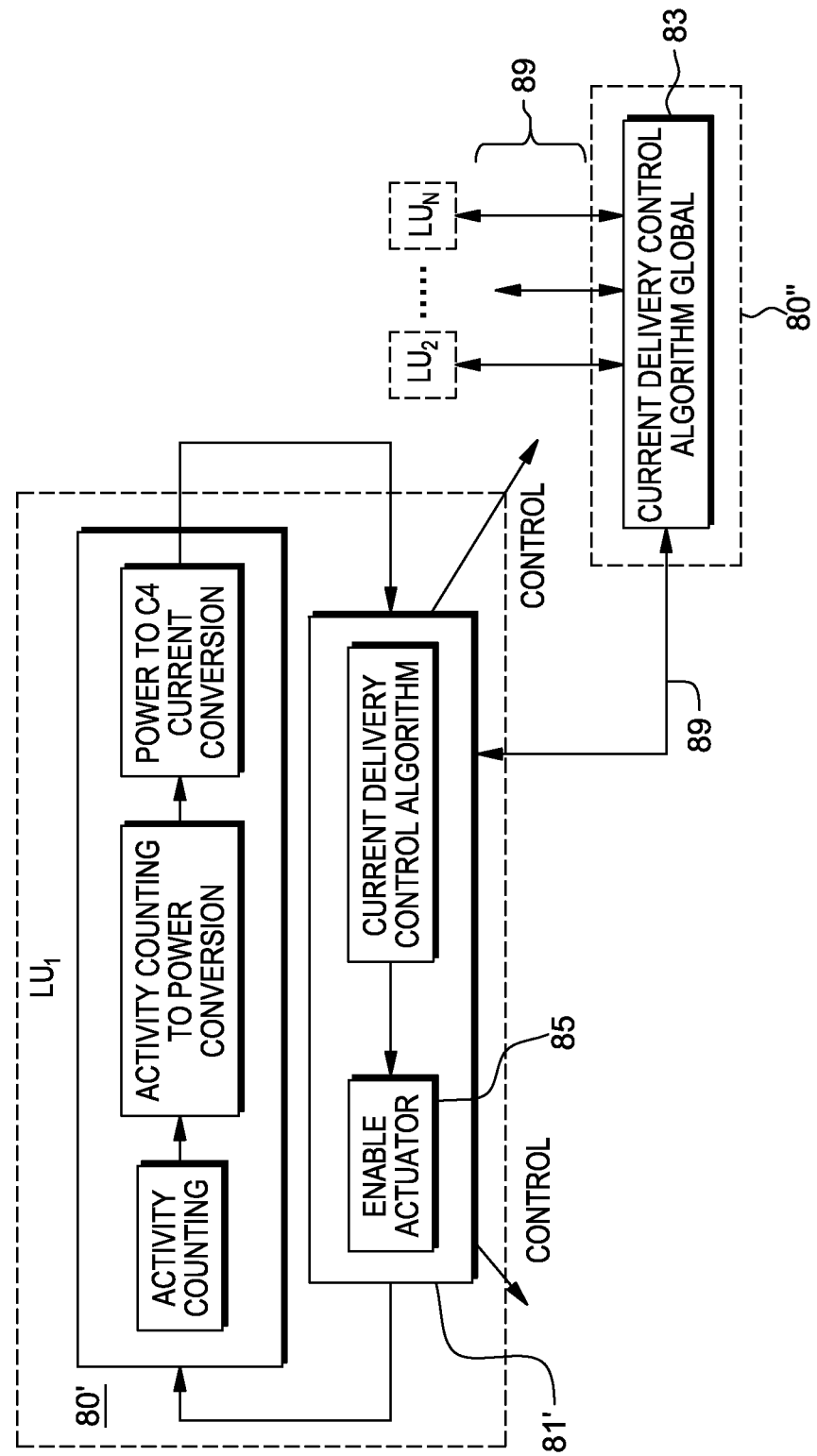

In an alternative or additional embodiment as shown in FIG. 7C, the CDCU control block 80' itself is implemented as a Local Current Delivery Control Unit ($L_{U1}$) configured to implement a local current delivery control part of the processing loop, and specifically the actuation of local current limiting mechanisms at functional blocks in pre-determined area or grid regions as will be described herein below. Thus, as shown in FIG. 7C, plural Local Current Delivery Control Units $L_{U1}$ to $L_{UN}$ are configured to act in a respective local region of the chip for current delivery control. The power estimation/activity measurement part is performed in the local CDCU shown as 80' as described with respect to FIGS. 7A, 7B wherein measuring operations 90 are performed that include: the measuring of activity levels at various functional blocks and/or C4 connections of the die, and the performing an operation to convert the activity levels to a power level which are then converted to current levels to obtain the real-time C4 current measures at the die under the workload conditions. The global current control algorithm 83 operating in a global CDCU 80" processes activity measurement signals from each of the $L_{U1}$ to $L_{UN}$ to determine local current level controls. The global CDCU 80" interfaces with a CDCU control block 81' of each individual $L_{U1}$ to $L_{UN}$ to control, via respective control signals 89, the built in actuators 85 therein for invoking the local current delivery controls in a respective functional block, e.g., macro, unit, core, or CPU in pre-determined area or grid regions.

It should be understood that various other implementations for global CDCU are possible. For example, the current control delivery mechanisms in FIG. 7A-7C may be implemented alone or in any combination. They may be located off-chip as well but preferably as part of the on-chip power controller. Moreover, the CDCU units may be implemented by software and monitored by host system.

In the embodiments described herein, the CDCU units guarantee that the current limit is met at any time or never exceeds for a longer period of time by dispatching/scheduling the instructions or scheduling workloads properly. Control/actuation can be performed locally/globally or a combination of both.

Figure 8B:
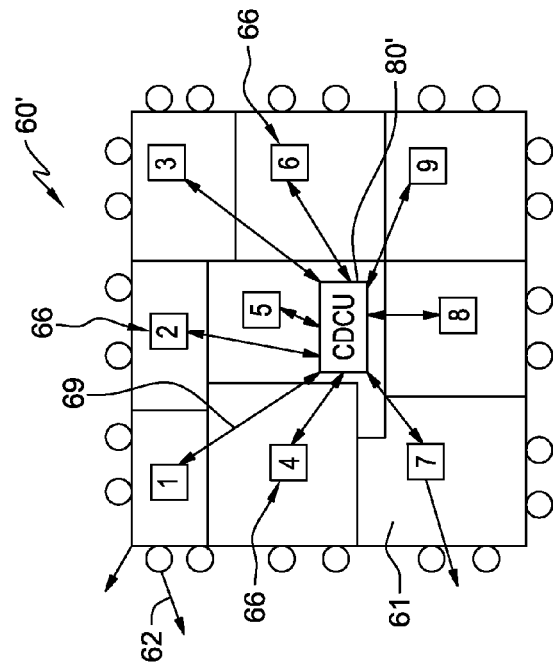
FIGS. 8A-8D depict various chip architectures for implementing the current delivery control solutions of FIGS. 7A-7C to regions of the chip in various embodiments.
Figure 8A:
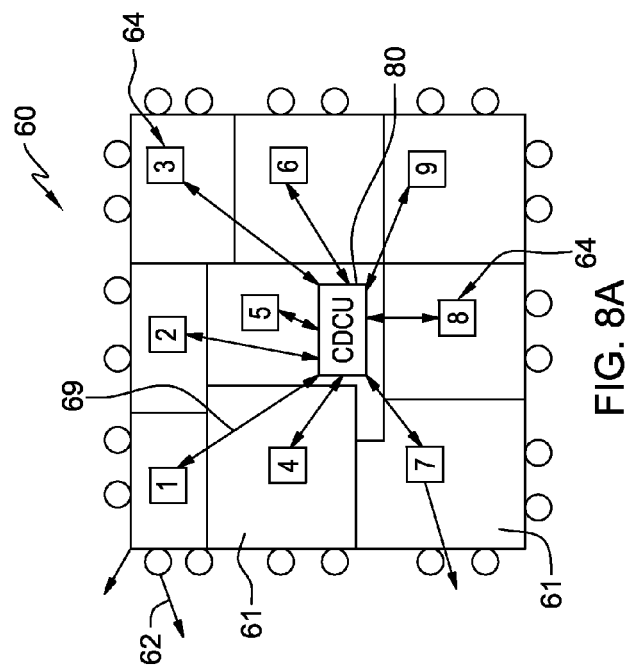
Figure 8D:
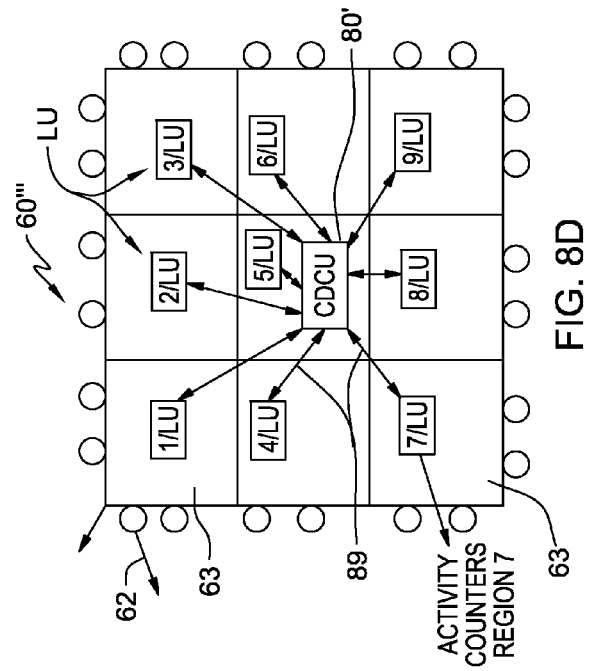
Figure 8C:
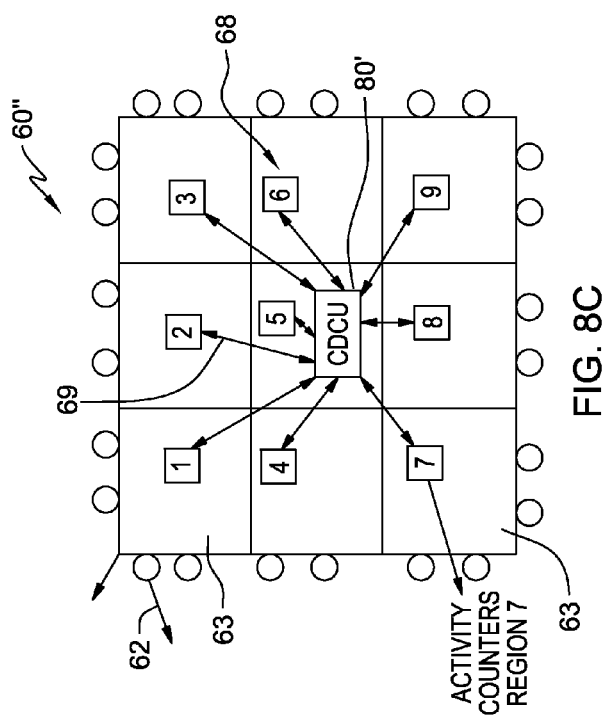

The architecture for implementing the current delivery control solutions of FIGS. 7A-7C is now described with respect to FIGS. 8A-8C. In an embodiment of FIG. 8A, a chip or chip portion 60 having C4 bumps 62 distributed on the chip is shown divided into non-uniform grid regions 61, for example regions 61 labeled 1, . . . , 9. In the embodiment of FIG. 8A, the CDCU 80 of FIG. 7A is situated and configured to send control/actuation signals to and receive sensor measurement data signals 69 from the distributed power estimation (e.g., activity) sensors 64 for estimating current drawn in the each region 61 of the grid to obtain a C4 current at each C4 bump 62.

From the collected sensor measurement values, the control algorithm will initiate corrective action to prevent exceeding a maximum C4 current limit at any C4 connection (bump). For example, the algorithm processes the measured or sensed values and implements an actuator to generate a control signal 88 to effect a local actuation such as a preventive response. For example, if it is sensed, or if an activity counter's count values indicate that C4 current limit is being exceeded when performing an operation, e.g., multiplying, the control algorithm is invoked to address the situation. In one embodiment, the algorithm may responsively generate a control signal to throttle timing of execution of an operation, e.g., operate on every other clock cycle, or effectively reducing its frequency of operation. Other operations may be actuated including: providing instruction sequencing control which is part of the chip control loop architecture described in connection with an example instruction sequencing unit (ISU) described herein with respect to FIG. 9.

In an embodiment of FIG. 8B, a chip or chip portion 60' having C4 bumps 62 distributed on the chip is shown divided into non-uniform grid regions 61, for example regions 61 labeled 1, . . . , 9. In the embodiment of FIG. 8B, the CDCU 80' of FIG. 7B is situated and configured to send and receive control and data signals 69 to the distributed activity counters 66 for controlling activity monitoring and generating count values used for estimating current drawn in the each region 61 of the grid. The types of activity that count values are generated by activity sensor or counter includes: the number of times or occurrences of certain chip activities, e.g., a memory access, a CPU issuing an instruction, an access to a cache, the performing a multiplication operation or arithmetic operation in a functional unit such as an arithmetic logic unit. It is from a set of specially architected activity counters that deduce C4 current measurement. One algorithm for converting power to C4 current conversion is described in commonly-owned, herein-incorporated U.S. patent application Ser. No. 13/526, 194. In a non-limiting example, the power to C4 current conversion algorithm is the same as described herein with respect to FIG. 3 showing how bin currents (current sources vector $I_S$) convert to C4 currents $I_{C4}$. However, in the power to C4 current conversion algorithm, $I_S$ indicates a vector of currents of the estimated power in the divided regions. That is, the chip layout is first divided into regions of the chip having located one or more physical connectors that deliver electrical current drawn by the current sources in the regions as connected via the grid network(s). As for the floorplanning, the sensitivity matrix A may be pre-computed to capture current distribution relation between the current sources, e.g., macros/units and physical connectors, e.g., C4 bumps. Then the power estimation measurement is made, e.g., to obtain a power consumption vector, e.g., $P_S$, in Watts or mW which is stored in vector $I_S$ in Amperes or mA of the current drawn for the divided regions (i.e., $I_S=P_S/Vdd$) where Vdd is a power supply voltage value powering the chip blocks. Then matrix A is used to obtain the current flow through the physical connectors $I_{C4}$ with respect to an amount of current drawn for divided regions $I_S$ according to $I_{C4}=A*I_S$.

Different correlation and power proxy functions converting power from activity levels can be found in references to M. Floyd, M. Ware, K. Rajamani, T. Gloekler, B. Brock, P. Bose, A. Buyuktosunoglu, J. Rubio, B. Schubert, B. Spruth, J. Tierno, L. Pesantez. Adaptive Energy Management Features of the IBM POWER7 Chip. IBM Journal of Research and Development, Vol. 55, May/June 2011; and, M. Floyd, M. Ware, K. Rajamani, B. Brock, C. Lefurgy, A. Drake, L. Pesantez, T. Gloekler, J. Tierno, P. Bose, A. Buyuktosunoglu. Introducing the Adaptive Energy Management Features of the POWER7 chip. IEEE Micro, March/April 2011. In one embodiment, in the uniform or non-uniform grid regions, the activity is measured in those grid regions 61 and the conversion computations/actuations may be performed at a global central current manager through the current delivery control unit 80 or 80'.

In another form, the chip can be divided into uniform grids where the activity is measured in those grids and conversion computations are performed globally. Thus, in an embodiment of FIG. 8C, a chip or chip portion 60" having C4 bumps 62 distributed on the chip is shown divided into uniform grid regions 63, for example regions 63 labeled 1, . . . , 9. In the embodiment of FIG. 8C, the CDCU 80 of FIG. 7A or CDCU 80' of FIG. 7B is situated and configured to send and receive control and data signals 69 to the distributed activity counters or like power estimation devices 88 for controlling current activity monitoring and estimating current drawn in the each uniform grid region 63.

In either uniform or non-uniform grid regions, the regions 61, 63 in FIGS. 8A-8C may be of a size according to granularity of a macro, a functional unit, or a core. In a further embodiment, the activity that is measured in those grids 61, 63 and the conversion computations/actuations may be performed at a global central current manager through the current delivery control unit 80 or 80'.

In an embodiment of FIG. 8D, a chip or chip portion 60''' having C4 bumps 62 distributed on the chip is shown divided into uniform grid regions 63, for example regions 63 labeled 1, . . . , 9 (e.g. at macro level or functional unit level). There is a global CDCU 80' of FIG. 7C that may be part of an on-chip microcontroller to perform the measurement part of the loop that is situated and configured to receive power measurement signals obtained by activity counting mechanisms from the distributed power estimation (e.g., activity) sensors for estimating current drawn in the each respective region 63 of the grid to obtain an estimated C4 current level value in one embodiment. However, further included at each region 63 labeled 1, . . . , 9, for example, is a Local Current Delivery Control Unit $LU_1, \ldots LU_9$, such as shown in FIG. 7C, that is configured to locally implement the control part of the processing loop at each grid region 63, and specifically the actuation of current limiting features at each local grid region 63.

Figure 9:
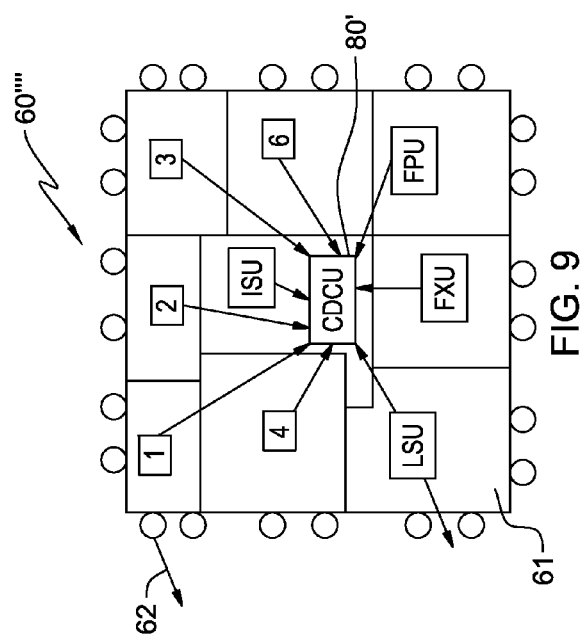
FIG. 9 shows a further example of a further implementation of a chip control loop architecture in one embodiment.

FIG. 9 depicts a further implementation of a chip control loop architecture in one embodiment for a chip or chip portion 60''' having C4 bumps 62 distributed on the chip and shown divided into non-uniform grid regions 61, for example regions 61 labeled 1, . . . , 9. In each region is an activity counter that monitors activity of various functional units including, but not limited to: an ISU: Instruction Sequencing Unit; an LSU: Load/Store Unit; an FXU: Fixed Point Unit; and a FPU: Floating Point Unit, located in a respective region 61 of the grid. In an example implementation, a C4 current measurement is autonomously obtained from the activity counters and power conversion algorithms in the CDCU 80'. If a C4 current measurement in a region is less than a programmed threshold, then in one embodiment, the actuation of a current limiting mechanism is not invoked. For example, in one embodiment, for a region 61 having the LSU, if it is determined that a C4_current_region_LSU>threshold_i, then the LSU instruction issue rate may be throttled, i.e., reduced, otherwise, the normal LSU instruction issue rate is maintained at that region having the LSU. In one embodiment, to reduce issue rate: the actuators 85 in FIG. 7A-7C are programmed to throttle, i.e., reduce, a number of LSU instructions issued at a time, e.g., LSU instructions are issued every other cycle, or every other X cycles (X: can be any number). In one embodiment, the C4_current_region_LSU current may be computed as a sum of C4 current across all the macros of LSU or sum of C4 currents across a specified set of macros in LSU. That is, the granularity of the activity monitoring is at the unit level, or macro within the LSU unit.

It is understood that, without loss of generality, the throttling mechanism described with respect to FIG. 9 additionally applies to other units ISU, FPU, FXU, etc., in a grid region, and any sub-block within the macro or unit.

It is understood that several of the architecture forms shown herein with respect to FIGS. 8A-8D can be deployed in an architecture, alone or in combination.

In a further embodiment, there is obviated the need to use CDCU and activity monitoring system as shown in FIGS. 7A-7C by implementing a token-based monitoring approach. This approach is based on the insight that is may be acceptable to exceed the C4 current limit for a very short period of time, but not for a long duration. Therefore, there is performed controlling the activity in a sliding window of time which permits use of a given unit for short periods with high activity, as long as the average in the time window is below a given threshold.

In one embodiment, in the C4-Aware Token-Based operation, each block e.g., macro, unit, core, CPU etc., gets or receives Tokens. Tokens may be issued and received at the blocks periodically. For example, one block may issue tokens to another block, or an Operating System of hypervisor unit may issue tokens to blocks. A block may additionally be programmed to allocate tokens to itself, e.g., periodically.

When the block is used to perform an operation, one of the Tokens gets exhausted (i.e., a token count associated with that unit gets decremented). This allows the unit to be operated at high utilization for a short time (as long as there are enough tokens). The tokens are allocated to functional units, macros, cores, at a constant token generation rate. Given that tokens are allocated to a unit at a constant rate, this ensures that the overall activity does not exceed that of the rate at which tokens are generated. The time window determines how many unused Tokens can be kept at a given unit.

Figure 10:
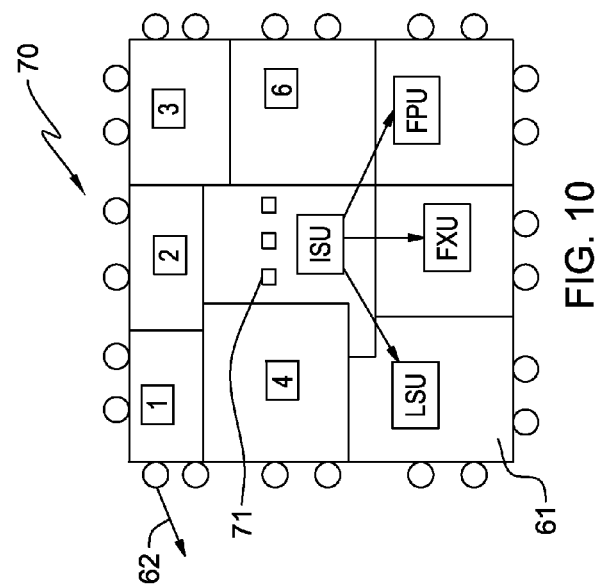
FIG. 10 depicts an implementation of a token-based current delivery control solution in a further embodiment for a chip or chip portion.

FIG. 10 depicts a token-based control loop implementation in one embodiment for a chip or chip portion 70 having C4 bumps 62 is distributed on the chip is shown divided into non-uniform grid regions 61, for example regions 61 labeled 1, . . . , 9. In each region 61, there is located various functional units including, but not limited to: an ISU: Instruction Sequencing Unit; an LSU: Load/Store Unit; an FXU: Fixed Point Unit; and a FPU: Floating Point Unit, located in a respective region 61. Further associated with a respective region 61 are the issued reserve tokens 71 associated with the particular unit, e.g., ISU. In an example implementation, instruction throttling of the various functional units show in the architecture of FIG. 10, is performed according to a method 500 shown in FIG. 11.

FIG. 11 particularly shows a method that, in a sliding window of time, a particular unit is issued given tokens when a unit is to perform high activity for a unit of time. With a token, the unit can perform activity. The tokens ensure that the C4 current limits are not exceeded.

For example, as shown in FIG. 11, based on either the presilicon/postsilicon modeling results, which provide knowledge of high activity areas, for example, the token currency is issued to a unit in a grid that is representative of C4 current. In a first initialization 510, there is performed initializing a token_generation/cycle variable to a value "X"; initializing a token_generation_amount variable to a value "T"; initializing a token_expiry_period variable to a value T_exp; and, for an example LSU functional block in a grid 61, initializing the LSU reserve token LSU_tresv variable to a value of 0, for that functional unit. It is understood that X, T and T_exp variable values may be varied when run-time measurement is available. Then, at 515, during real-time workload operations, at each X cycle, there is generated for issuance to the functional unit, e.g., LSU unit, the LSU_tresv amount of tokens 71 to the reserve. Then, at 520, it is autonomously determined for each issuance by an ISU an LSU instruction and the LSU_tresv is greater than 0, then it is permitted for the ISU to issue an LSU instruction as the token reserve 71 for the LSU is greater than 1. After issuance of the LSU instruction the LSU_tresv variable is decremented by 1 token (e.g., LSU_tresv-1). Otherwise, if it is determined at 520 that upon issuance by an ISU of an LSU instruction, the corresponding LSU_tresv is not greater than 0, then the ISU is prevented from issuing the LSU instruction as exceeding the current limit. Finally, as indicated at 530, FIG. 11, for each token issued to a LSU, a determination is made as to whether the token_lifetime value is greater than the T_exp value. Each instance a token_lifetime value has exceeded the T_exp value then the LSU_tresv variable is decremented by 1 token (e.g., LSU_tresv-1).

It is understood that there may be an amount of tokens initialized that is commensurate with expected activity levels. For example, based on pre-Silicon modeling, or other knowledge, it may be deduced that LSU may be initially assigned a greater amount of tokens than another unit for example that is not as active. For example, the LSU may issue four (4) load instructions at one time (accessing logic or memory), which is converted to a C4 current estimation, and giving this knowledge, the number of tokens issued to the LSU every X cycles will be sufficient to accommodate the expected behavior of the functional unit during workload conditions.

It is further understood that, without loss of generality, the token-based throttling mechanism 500 described with respect to FIG. 11 additionally applies to other units ISU, FPU, FXU, etc., in a grid region, and any sub-block within the macro or unit.

In a further embodiment, both the CDCU and token-based current monitoring and current delivery throttling methods and chip architectures described herein, can be extended to a 3D/Silicon carrier micro-architectures (e.g., "stacked" chip or 3-D memory implementations) including settings where different C4 pitch and dimension exist. For example, in a 3D package CDCU can operate both on lower C4s as well as upper layer C4s, or micro C4s.

Figure 12A:
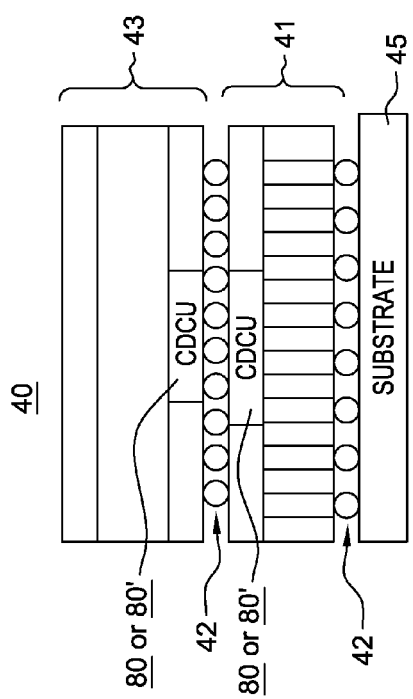
FIG. 12A shows one embodiment of a vertically stacked chip configuration 40 in which the methods and chip architectures of the present embodiments may be employed.

FIG. 12A shows one embodiment of a vertically stacked chip configuration 40 having first chip 41 of functional units in silicon or semiconductor material including a first lower C4 connection layer of C4 bumps 42 over a semiconductor substrate 45, and a second chip 43 of functional units in Silicon or semiconductor material including a second upper C4 connection bump layer of C4 bumps 44 over the first chip 41. In either embodiment, the CDCU units 80 and 80' or LU of FIGS. 7A-7C may be implemented in each chip at each level.

Figure 12B:
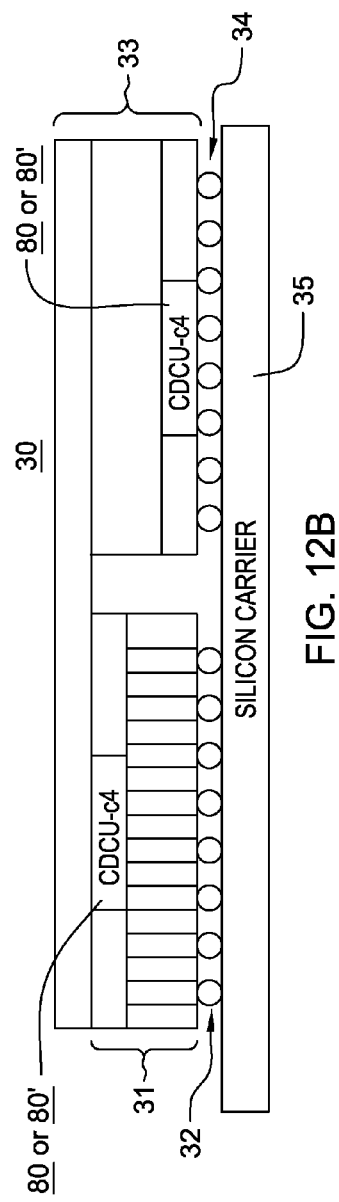
FIG. 12B shows one embodiment of a horizontally extended "flip chip" package 30 in which the methods and chip architectures of the present embodiments may be employed.

FIG. 12B shows one embodiment of a horizontally extended "flip chip" package 30 having multiple dies that communicate, e.g., chips 31 and 33 mounted on a Silicon substrate or carrier 35 via respective first C4 connection layer of C4 bumps 32 and second C4 connection layer of C4 bumps 34. In this configuration, the chips 31 and 33 communicate to each other over carrier 35. Via the embodiment 30 of FIG. 12, the CDCU units 80 and 80' or LU of FIGS. 7A-7C may be implemented in each chip.

Current Delivery Aware Scheduling

Figure 13:
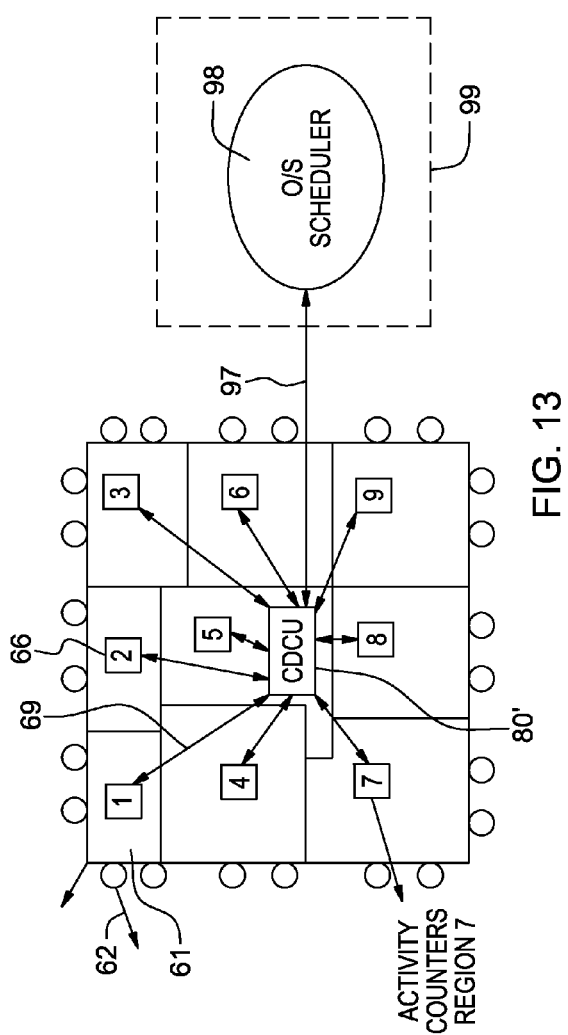
FIG. 13 shows an embodiment of a chip architecture for implementing the current delivery control solutions as in FIG. 8B, however, further interfaced with an operating system level scheduler to effect host O/S or hypervisor power throttling operations.

In this approach to C4 current limiting, there is leveraged the fact that in the case of large time periods where C4 current can be exceeded, the previous "measurement" apparatus is used with a scheduler device (not shown) to optimize C4 current problem. That is, given a large number of cores, and even large number of applications to run on it, the scheduler can choose to co-schedule applications such that the likelihood of exceeding current delivery limit is minimized. FIG. 13 shows an embodiment as in FIG. 8B, however, the CDCU80' is interfaced with an operating system level scheduler device 98 via signaling 97 between the CDCU provided in the chip and a host operating system of a computing system or computing device 99. Thus, in the embodiment shown in FIG. 13, the control delivery algorithm is implemented in the OS with scheduling decisions as the actuators. In a further embodiment, the "Activity Counting" as proxy for C4 current "measurement" maybe used.

Further to this embodiment, depicted in FIG. 13, there may be first performed a profile analysis of the application, running standalone, by measuring activity (without converting it into actual C4 current) in each C4 domain and store activity profile information in a table. Otherwise, a profile analysis of the application, running standalone, may include measuring C4 current in each C4 domain and storing profile activity of the region in a table. In accordance with a first embodiment of a scheduling policy: for every scheduling quantum: a determination is made as to whether the C4_current draw corresponding to operations at a region is greater than a threshold_C4 current draw for that region. A C4_current_region may be of a size according to granularity of a macro, a unit comprising one or more macros, a core comprising one or more units, or a central processing unit (CPU) having one or more cores and accelerator units, on-chip bus/network units, controller units, I/O units. A threshold_C4 current draw represents a maximum C4 current one can operate within. If it is determined that the C4_current draw corresponding to operations at a region is greater than a threshold_C4 current draw for that region then the scheduler device 98 will schedule the application operations at the O/S level or hypervisor level according to a min_C4_current profile. Otherwise, if it is determined that the C4_current draw corresponding to operations at a region is not greater than a threshold_C4 for that region then the scheduler device 98 will schedule the application operations at the O/S or hypervisor level according to its default policy. It is understood that the scheduling of operations in this embodiment, is according to a workload granularity level, as opposed to an instruction granularity level as in the hardware embodiments.

In accordance with a further embodiment of a scheduling policy: for every scheduling quantum: a determination is made as to whether the previous scheduling quantum activity in a C4 region is greater than a threshold activity level (threshold act), then application operations are scheduled by scheduler device 98 at the O/S or hypervisor level according to a min activity profile for that C4 region. Otherwise, if it is determined that the previous scheduling quantum of activity in a C4 region is not greater than a threshold activity level, then for that region then the scheduler device 98 will schedule the application operations according to its default policy. It is understood that the scheduling of operations in this embodiment, is according to a workload granularity level, as opposed to an instruction granularity level as in the hardware embodiments Hybrid: Chip Design+Workload Based Optimization As mentioned above, in one aspect, in the "pre-Silicon" approach of a multi-core processor chip, C4s are designed and allocated unevenly to blocks, e.g., cores or units, and in the "post-Silicon" approach, workload based optimization is performed to exploit the heterogeneity.

In a current aware chip design and workload based optimization technique, during presilicon design, there is heterogeneous allocation of C4s (unevenly or non-uniformly) corresponding to respective cores or blocks that works harder, so the more C4s can handle the increased current draws. Thus, there is stressed workload or workload operations scheduled according to the allocated C4s. For example, at O/S, hypervisor or scheduler level, there is viewed the applications and types of instructions at workload, and the scheduler may schedule more work intensive instructions at the regions having more C4s allocated, e.g., load and multiply operations, and schedule less work intensive instructions at the regions having as less C4s allocated.

Figure 14:
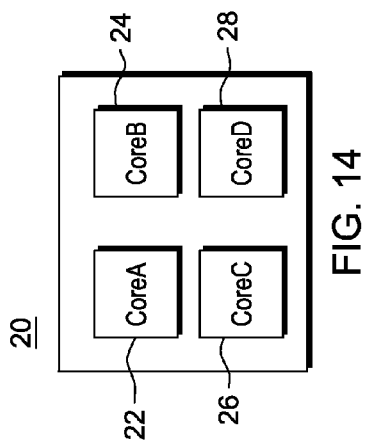
FIG. 14 shows an example multi-core processor chip 20 where the allocation of C4 connections to a given functional unit is varied across cores.

Considering now FIG. 14, there is depicted an example processor chip 20 where the allocation of C4 structures to a given functional unit is varied across cores. For example, some cores have more C4 structures for FPU, e.g., Core A 22, and some cores have more C4 for load/store instructions, e.g., Core B 24; another core has more C4 for Integer Unit, e.g., Core C 26; and, another core, Core D 28, has C4 allocation based in proportion to the average activity across FUBs. In one embodiment, all the cores 22, 24, 26, 28 are functionally identical. However, power delivery design for each core may be run at a different power corner application. The C4 structure footprint and power grid is optimized with respect to different power corners. Power and performance is improved by allocating the applications to cores based on the type of instructions in the workload. For example, instructions for FPU-heavy applications can be issued to run on core B.

For example, if C4s can be placed in a particular area of the chip, and all populated, then during a post-silicon phase, the method can be optimized. For example, given an IC die of 4 microprocessor cores (each core, having multiple functional units therein, e.g., bus, cache memory, fetch unit, decode unit, instruction sequencing unit, execution units such as fixed point unit, floating point unit, load/store unit) and amount, e.g., 100, of C4s can be implemented, e.g., to typically provide an equal distribution, e.g., 25, of C4 connections allocated to a core—this is a homogeneous arrangement. In one embodiment, this can be modified to heterogeneous C4 populated cores, i.e., an unequal distribution of C4 connections, where a single core may have, e.g., 50 of C4 connections associated, and another core may have 25 C4s associated, etc. Thus, during a "post-Silicon" approach, a program running on the chip may be designed and scheduled to operate higher power operations on the processor core having the more C4 allocated. That is, in this embodiment, there is an intentional distribution of cores non-uniformly and operations on the chip are designed/programmed accordingly to exploit the heterogeneity.

In a further embodiment, in an Extended Cache Option (ECO) mode of operation, only a few cores are turned on and the caches of the other cores is used to provide an effective cache capacity. The C4 current-aware design can provide a higher performance for such ECO mode rather than a C4-oblivious or homogenous or uniform architectures. For example, Core A 22 and Core C 26 are located in a region that can be allocated more C4, whereas Core B 24 and Core D 28 may be in a region that allocates fewer C4s. In the ECO mode Cores A and C are kept on, and B and D are turned off. This way the overall throughput is determined by cores that have received a larger number of C4s, resulting in higher overall performance (as those cores leverage more activity).

In one embodiment, referred to as an overclocking mode of operation, only a few (blocks, e.g., cores) are turned on and these cores are run at a higher clock frequency compared to nominal clock frequency. The C4-aware design can provide a higher performance for such a mode rather than a C4-oblivious arch. For example, Core A and Core C can get more C4 whereas Core B, Core D get fewer C4s. Thus, in the overclock mode, cores A and C may be kept on, and B and D are turned off. This way the overall throughput is determined by cores that have received a larger number of C4s, resulting in higher overall performance.

In a further mode of operation, both overclocking and ECO modes of operation are combined, e.g., Core A and Core C can be overclocked as well as use the caches of other (turned off) cores.

Figure 15:
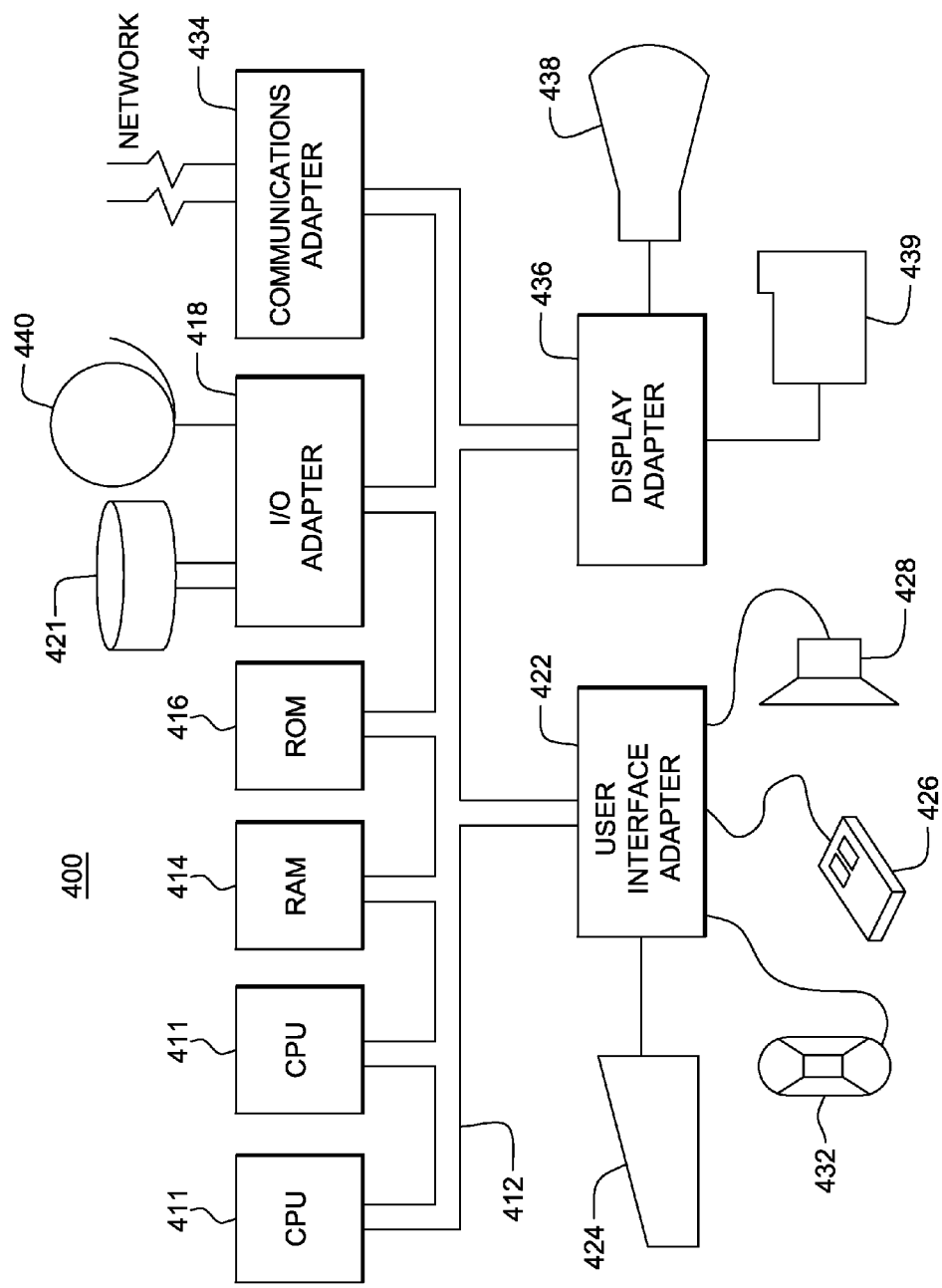
FIG. 15 illustrates an exemplary computing system 400 configured for designing a semiconductor chip floorplan and monitoring C4 current draw at various functional units and C4 connections of a semiconductor chip.

FIG. 15 illustrates an exemplary hardware configuration of a computing system 400 running and/or implementing the method steps described herein with respect to FIGS. 2, 5, 6, 11. The hardware configuration preferably has at least one processor or central processing unit (CPU) 411. The CPUs 411 are interconnected via a system bus 412 to a random access memory (RAM) 414, read-only memory (ROM) 416, input/output (I/O) adapter 418 (for connecting peripheral devices such as disk units 421 and tape drives 440 to the bus 412), user interface adapter 422 (for connecting a keyboard 424, mouse 426, speaker 428, microphone 432, and/or other user interface device to the bus 412), a communication adapter 434 for connecting the system 400 to a data processing network, the Internet, an Intranet, a local area network (LAN), etc., and a display adapter 436 for connecting the bus 412 to a display device 438 and/or printer 439 (e.g., a digital printer of the like).

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with a system, apparatus, or device running an instruction.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with a system, apparatus, or device running an instruction. Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may run entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which run via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which run on the computer or other programmable apparatus provide processes for implementing the functions/acts specified in the flowchart and/or block diagram block or blocks.

The flowcharts and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more operable instructions for implementing the specified logical function(s). It should also be noted that, in some alternative implementations, the functions noted in the block may occur out of the order noted in the figures. For example, two blocks shown in succession may, in fact, be run substantially concurrently, or the blocks may sometimes be run in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While there has been shown and described what is considered to be preferred embodiments of the invention, it will, of course, be understood that various modifications and changes in form or detail could readily be made without departing from the spirit of the invention. It is therefore intended that the scope of the invention not be limited to the exact forms described and illustrated, but should be construed to cover all modifications that may fall within the scope of the appended claims.

What is claimed is:

1. A method for integrated circuit (IC) chip and package design and IC chip operation comprising:
dividing a layout region of said chip containing one or more current sources, one or more electrical connectors and grid networks, into a number of bins, said electrical connectors delivering electrical current drawn by said current sources of said layout region via said grid networks;

generating a data structure representing a current distribution relation between said bins and the one or more electrical connectors, the data structure comprising a set of weighted vectors, each weighted vector representing a sensitivity of electrical connector currents with respect to each said bin, and indicating for each bin, a portion of bin current distributed to each electrical connector;

obtaining, using said data structure, an amount of current flow via said electrical connectors with respect to an amount of current drawn by said current sources in said bins; and determining, using said current flow and current drawn amounts, a non-uniform allocation of electrical connectors to IC regions where blocks having said one or more current sources are located, with respect to one or more objectives and constraints, wherein a constraint includes a limit of electrical connector current to be drawn and a block including a central processing unit including one or more cores operating therein in said layout region, and subsequently operating blocks in said regions at current draw activity levels according to the non-uniform allocation, said operating including:

scheduling, by an operating system (O/S) or hypervisor or a host system, workload operations of applications to run at said IC at scheduled times at a region of said layout, said host system allocating said workload operations of said applications to said one or more cores based on the type of instructions of said applications and according to the non-uniform allocation of said electrical connectors, wherein a programmed processor unit performs one or more said generating, obtaining, determining and operating.

2. The method of claim 1, wherein a core includes a bus unit, cache memory, fetch unit, decode unit, instruction sequencing unit, execution units such as fixed point unit, floating point unit, load/store unit.

3. The method of claim 1, wherein said block locations and current draw amounts effect a non-uniform allocation of electrical connectors to IC regions according to a target power delivery requirement of each said blocks, wherein an allocation of electrical connectors to grid networks is optimized with respect to different power corners.

4. The method of claim 1, wherein said scheduling further comprises: scheduling a workload or workload operations of a program running on the chip to perform increased activity and drawn-current levels on a core operating in regions having a greater amount of electrical connectors allocated as compared to activity and drawn-current levels at a core operating in regions having less electrical connectors allocated.

5. The method of claim 4, wherein a core includes a cache memory unit, said operating said core at said increased activity and drawn-current level comprising: operating said core at a higher clock frequency compared to nominal clock frequency, utilizing one or more cache memory units from other cores, or both operating said core at said higher clock frequency and utilizing caches of other cores in regions having less amount of electrical connectors allocated.

6. The method of claim 1, wherein said (IC) is a 3-Dimensional or of a stacked chip architecture, said blocks having current sources being located on separate physical layers of a stacked arrangement, or displaced horizontally from each other on a common carrier.

7. The method of claim 1, wherein said amount of current flowing through an electrical connector is obtained as a product of a vector of current, $I_S$, drawn by the current sources and the current distribution relation data structure, said vector $I_S$ of current represents an aggregate current drawn for each respective bin from the current sources included in said blocks or portions thereof in the respective bin.

8. The method of claim 1, wherein said scheduling comprises: a dispatching of instructions or scheduling of said workloads on a CPU to balance and lower a current draw at said electrical connectors, wherein a current limit at an electrical connector is met at any time or never exceeds a determined value for a time period of operation.

9. A system for integrated circuit (IC) chip and package design and IC chip operation comprising:

a computer system including a memory storage device and a programmed processor unit in communication with said memory storage device, said programmed processor unit configured to:

divide a layout region of said chip containing one or more current sources, one or more electrical connectors and grid networks, into a number of bins, said electrical connectors delivering electrical current drawn by said current sources of said layout region via said grid networks;

generate a data structure representing a current distribution relation between said bins and the one or more electrical connectors, the data structure comprising a set of weighted vectors, each weighted vector representing a sensitivity of electrical connector currents with respect to each said bin, and indicating for each bin, a portion of bin current distributed to each electrical connector;

obtain, using said data structure, an amount of current flow via said electrical connectors with respect to an amount of current drawn by said current sources in said bins; and determine, using said current flow and current drawn amounts, a non-uniform allocation of electrical connectors to IC regions where blocks having said one or more current sources are located, with respect to one or more objectives and constraints, wherein a constraint includes a limit of electrical connector current to be drawn and a block including a central processing unit including one or more cores operating therein in said layout region, and subsequently operate blocks in said regions at current draw activity levels according to the non-uniform allocation, wherein to subsequently operate, a programmed processor unit performs scheduling workload operations of applications to run at said IC at scheduled times at a region of said layout, said host system allocating said workload operations of said applications to said one or more cores based on the type of instructions of said applications and according to the non-uniform allocation of said electrical connectors.

10. The system as claimed in claim 9, wherein a core includes a bus unit, cache memory, fetch unit, decode unit, instruction sequencing unit, execution units such as fixed point unit, floating point unit, load/store unit.

11. The system as claimed in claim 9, wherein said block locations and current draw amounts effect a non-uniform allocation of electrical connectors to IC regions according to a target power delivery requirement to said blocks, wherein an allocation of electrical connectors to grid networks is optimized with respect to different power corners.

12. The system as claimed in claim 9, further comprising: scheduling workload or workload operations of a program running on the chip to perform increased activity and drawn-current levels on a core operating in regions having a greater amount of electrical connectors allocated as compared to activity and drawn-current levels at a core in regions having less electrical connectors allocated.

13. The system as claimed in claim 12, wherein a core includes a cache memory unit, said operating said core at said higher activity and drawn-current levels comprising: operating said core at a higher clock frequency compared to nominal clock frequency, utilizing one or more cache memory units from other cores, or both operating said core at said higher clock frequency and utilizing caches of other cores in regions having less amount of electrical connectors allocated.

14. The system of claim 9, wherein said amount of current flowing through a electrical connector is obtained as a product of a vector of current, $I_S$, drawn by the current sources and the current distribution relation data structure, said vector $I_S$ of current represents an aggregate current drawn for each respective bin from the current sources included in said blocks or portions thereof in the respective bin.

15. The system of claim 9, wherein to subsequently operate, a programmed processor unit performs: a dispatching of instructions or scheduling of said workloads on a CPU to balance and lower a current draw at said electrical connectors, wherein a current limit at an electrical connector is met at any time or never exceeds a determined value for a time period of operation.

16. A computer program product for integrated circuit (IC) chip and IC chip operation, the computer program product comprising a tangible storage device readable by a processing circuit and storing instructions run by the processing circuit for performing a method, the method comprising:

dividing a layout region of said chip containing one or more current sources, one or more electrical connectors and grid networks, into a number of bins, said electrical connectors delivering electrical current drawn by said current sources of said layout region via said grid networks;

generating a data structure representing a current distribution relation between said bins and the one or more electrical connectors, the data structure comprising a set of weighted vectors, each weighted vector representing a sensitivity of electrical connector currents with respect to each said bin, and indicating for each bin, a portion of bin current distributed to each electrical connector;

obtaining, using said data structure, an amount of current flow via said electrical connectors with respect to an amount of current drawn by said current sources in said bins; and determining, using said current flow and current drawn amounts, a non-uniform allocation of electrical connectors to IC regions where blocks having said one or more current sources are located, with respect to one or more objectives and constraints, wherein a constraint includes a limit of electrical connector current to be drawn and a block including a central processing unit including one or more cores operating therein in said layout region, and subsequently operating blocks in said regions at current draw activity levels according to the non-uniform allocation, said operating including:

scheduling, by an operating system (O/S) or hypervisor or a host system, workload operations of applications to run at said IC at scheduled times at a region of said layout, said host system allocating said workload operations of said applications to said one or more cores based on the type of instructions of said applications and according to the non-uniform allocation of said electrical connectors.

17. The computer program product of claim 16, wherein said block locations and current draw amounts effect a non-uniform allocation of electrical connectors to IC regions according to a target power delivery requirement of each said blocks, wherein an allocation of electrical connectors to grid networks is optimized with respect to different power corners.

18. The computer program product of claim 16, further comprising: scheduling workload or workload operations of a program running on the chip to perform increased activity and drawn-current levels on a core operating in regions having a greater amount of electrical connectors allocated as compared to activity and drawn-current levels at a core in regions having less electrical connectors allocated.

19. The computer program product as claimed in claim 18, wherein a core includes a cache memory unit, said operating said core at said higher activity and drawn-current levels comprising: operating said core at a higher clock frequency compared to nominal clock frequency, utilizing one or more cache memory units from other cores, or both operating said core at said higher clock frequency and utilizing caches of other cores in regions having less amount of electrical connectors allocated.

20. The computer program product of claim 16, wherein said amount of current flowing through a electrical connector is obtained as a product of a vector of current, $I_S$, drawn by the current sources and the current distribution relation data structure, said vector $I_S$ of current represents an aggregate current drawn for each respective bin from the current sources included in said blocks or portions thereof in the respective bin.

21. The computer program product of claim 16, wherein said scheduling comprises: a dispatching of instructions or scheduling of said workloads on a CPU to balance and lower a current draw at said electrical connectors, wherein a current limit at an electrical connector is met at any time or never exceeds a determined value for a time period of operation.

* * * * *